United States Patent
Cho

(10) Patent No.: US 7,651,907 B2
(45) Date of Patent: Jan. 26, 2010

(54) METHOD FOR FABRICATING SEMICONDUCTOR DEVICE

(75) Inventor: Jun-Hee Cho, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 20 days.

(21) Appl. No.: 12/005,442

(22) Filed: Dec. 26, 2007

(65) Prior Publication Data

US 2008/0305608 A1 Dec. 11, 2008

(30) Foreign Application Priority Data

Jun. 11, 2007 (KR) .................. 10-2007-0056547

(51) Int. Cl.
*H01L 21/8234* (2006.01)
*H01L 21/8244* (2006.01)
*H01L 21/8242* (2006.01)
*H01L 21/20* (2006.01)

(52) U.S. Cl. .............. 438/238; 438/240; 438/253; 438/254; 438/255; 438/396; 438/397; 438/670; 257/E21.011; 257/E21.019; 257/E21.648; 257/E21.495

(58) Field of Classification Search .......... 257/E21.011, 257/E21.019, E21.648, E21.495
See application file for complete search history.

(56) References Cited

U.S. PATENT DOCUMENTS

| 6,319,769 | B1* | 11/2001 | Cho | 438/255 |
|---|---|---|---|---|
| 6,355,521 | B1* | 3/2002 | Cho | 438/254 |
| 6,383,867 | B1* | 5/2002 | Kim et al. | 438/253 |
| 2002/0090778 | A1* | 7/2002 | Kim | 438/240 |
| 2003/0075753 | A1* | 4/2003 | Chu et al. | 257/308 |
| 2006/0024883 | A1* | 2/2006 | Hwang | 438/253 |
| 2007/0082471 | A1* | 4/2007 | Kang et al. | 438/593 |
| 2008/0057706 | A1* | 3/2008 | Kim et al. | 438/670 |
| 2008/0081431 | A1* | 4/2008 | Roh et al. | 438/397 |

FOREIGN PATENT DOCUMENTS

| KR | 1020040059932 A | 7/2004 |
|---|---|---|
| KR | 1020070041860 A | 4/2007 |
| KR | 1020070054933 | 5/2007 |

* cited by examiner

*Primary Examiner*—Charles D Garber
*Assistant Examiner*—Mohsen Ahmadi
(74) *Attorney, Agent, or Firm*—Blakely, Sokoloff, Taylor & Zafman

(57) ABSTRACT

A method for fabricating a semiconductor device, the method includes forming an etch stop layer and an insulation layer over a substrate having a first region and a second region, selectively removing the insulation layer and the etch stop layer in the first region to expose parts of the substrate, thereby forming at least two electrode regions on the exposed substrate and a resultant structure, forming a conductive layer over the resultant structure, removing the conductive layer in the second region, removing the insulation layer in the first region and the second region by using wet chemicals, and removing parts of the conductive layer, which formed between the at least two electrode regions in the first region, to form cylinder type electrodes in the first region.

16 Claims, 5 Drawing Sheets

METHOD FOR FABRICATING SEMICONDUCTOR DEVICE

CROSS-REFERENCE TO RELATED APPLICATIONS

The present invention claims priority of Korean patent application number 10-2007-0056547, filed on Jun. 11, 2007, which is incorporated by reference in its entirety.

BACKGROUND OF THE INVENTION

The present invention relates to a method for fabricating a semiconductor device, and more particularly, to a method for fabricating a cylinder type capacitor in the semiconductor device.

Although, a capacitance target area is scaled down since semiconductor devices, such as a dynamic random access memory (DRAM), become highly integrated, demanded capacitance is not decreased. Thus, various methods of forming a capacitor having a great capacitance on a small area are suggested. More particularly, a cylinder type capacitor is used for enlarging an electrode area.

FIGS. 1A to 1C illustrate cross-sectional views of a method for fabricating a typical cylinder type capacitor.

Referring to FIG. 1A, an etch stop layer 11 and an insulation layer 12 for storage nodes are successively formed over a substrate 10 having a given understructure. The insulation layer 12 and the etch stop layer 11 are selectively etched to expose a portion of the substrate 10 and thus form a trench 13 for a storage electrode region. Herein, the exposed portion of the substrate 10 may be used as a storage node contact.

Referring to FIG. 1B, a conductive layer is formed over a resultant structure including the trench 13. Thus, a storage electrode 14 is formed by performing an etch back process until the insulation layer 12 is exposed.

Referring to FIG. 1C, the insulation layer 12 is removed by using wet chemicals, leaving the cylinder type electrode 14. Then, although it is not shown, a dielectric layer and a plate electrode are successively formed over a surface of the cylinder type electrode 14 and thus, a capacitor structure is formed.

As the semiconductor devices become more highly integrated, an area of a storage electrode is also needed to be enlarged to secure sufficient capacitance. However, since there is a limitation to horizontally enlarge the area of the storage electrode, it is required to vertically enlarge the area of the storage electrode. That is, in order to enlarge the area of the storage electrode, a height of the storage electrode should be increased. In the meantime, in case of increasing a height of the cylinder type capacitor, the storage electrode may lean to a neighboring storage electrode when removing the insulation layer for storage nodes by using the wet chemicals and thus, a bridge is generated between neighboring storage electrodes due to the leaning effect. As a result, the semiconductor devices have defects.

SUMMARY OF THE INVENTION

The present invention is directed to provide a cylinder type capacitor in a semiconductor device, which can minimize a deterioration of the semiconductor devices by preventing a bridge between neighboring storage electrodes due to leaning of a neighbor storage electrode by removing an insulation layer for storage nodes prior to removing parts of a conductive layer for the storage node electrode, which formed between neighboring nodes.

In accordance with an aspect of the present invention, there is provided a method for fabricating a semiconductor device. The method includes a method for fabricating a semiconductor device, the method includes forming an etch stop layer and an insulation layer over a substrate having a first region and a second region, selectively removing the insulation layer and the etch stop layer in the first region to expose parts of the substrate, thereby forming at least two electrode regions on the exposed substrate and a resultant structure, forming a conductive layer over the resultant structure, removing the conductive layer in the second region, removing the insulation layer in the first region and the second region by using wet chemicals, and removing parts of the conductive layer, which formed between the at least two electrode regions in the first region, thereby forming cylinder type electrodes in the first region.

DESCRIPTION OF SPECIFIC EMBODIMENTS

FIGS. 2A to 2G illustrate cross-sectional views of a method for fabricating a cylinder type capacitor in accordance with an embodiment of the present invention. The method will be described hereinafter with the cylinder type capacitor in a semiconductor having two regions, namely a cell region and a peripheral region. In this case, a capacitor is formed in the cell region on a substrate, not in the peripheral region.

Figure 1A:
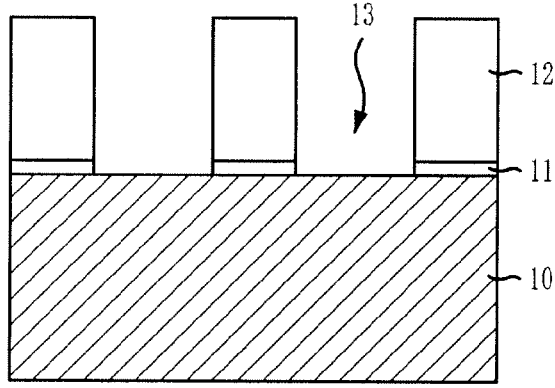
FIGS. 1A to 1C illustrate cross-sectional views of a method for fabricating a typical cylinder type capacitor.
Figure 1B:
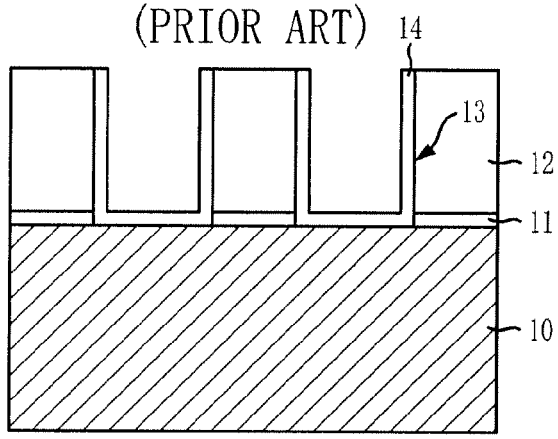
Figure 1C:
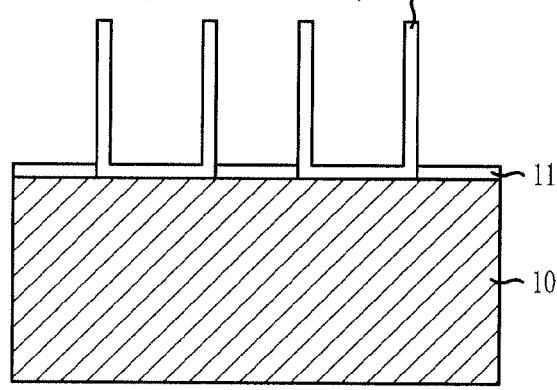
Figure 2A:
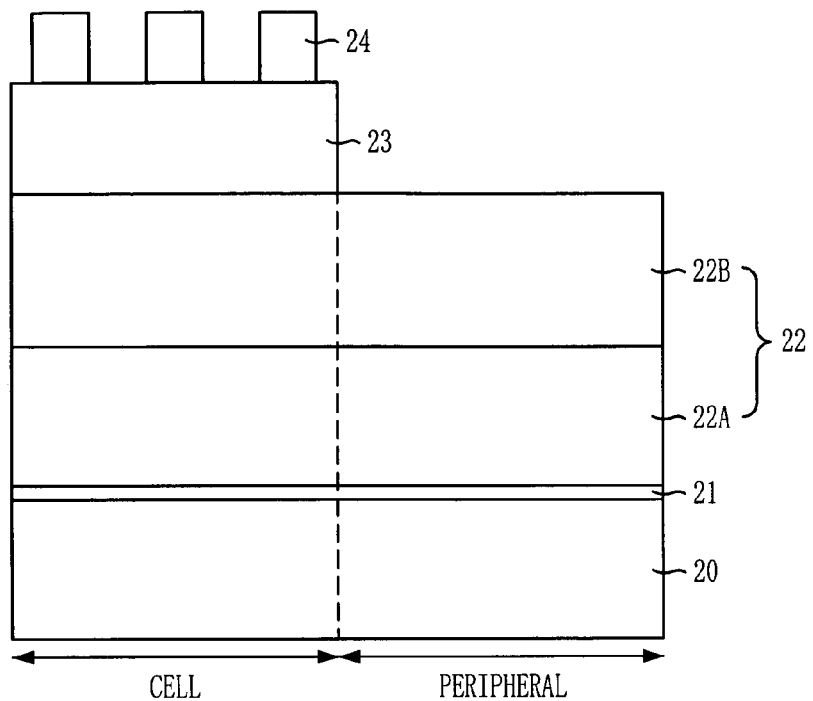
FIGS. 2A to 2G illustrate cross-sectional views of a method for fabricating a cylinder type capacitor in accordance with an embodiment of the present invention.

Referring to FIG. 2A, an etch stop layer 21 and an insulation layer 22 for storage nodes are sequentially formed over a substrate 20 where a first region and a second region are defined, wherein the first region is a cell region and the second region is a peripheral region. At this time, it is preferable that the etch stop layer 21 includes a nitride layer and the insulation layer 22 includes an oxide layer. In this embodiment described in drawings, there is shown the insulation layer 22 including successively stacked two layers 22A and 22B, wherein one layer 22A is a phosphosilicate glass (PSG) layer having a wet etch rate higher than a set etch rate of the other layer 22B. The other layer 22B is a plasma enhanced-tetra ethyl ortho silicate (PETEOS) layer. Thus, a width of a bottom of a subsequent storage electrode region can be extended by performing a wet etching process.

A hard mask 23 is formed only over a portion of the insulation layer 22 in the cell region. The hard mask 23 is used as an etch barrier during a subsequent etching process for forming the storage electrode region. The hard mask 23 includes an amorphous carbon layer or a stacked structure of the amorphous carbon layer and a silicon oxynitride (SiON) layer. Further, the hard mask 23 is formed into a multi function hard mask (MFHM) which is not only used as the etch barrier but is also used as an anti-reflection layer.

A photoresist pattern 24 is formed over the hard mask 23 to form the subsequent storage electrode region. It is desirable to form the photoresist pattern 24 by using an argon fluoride (ArF) exposure source and an anti-reflection layer (not shown) formed of an organic material may underlie the photoresist pattern 24.

Figure 2B:
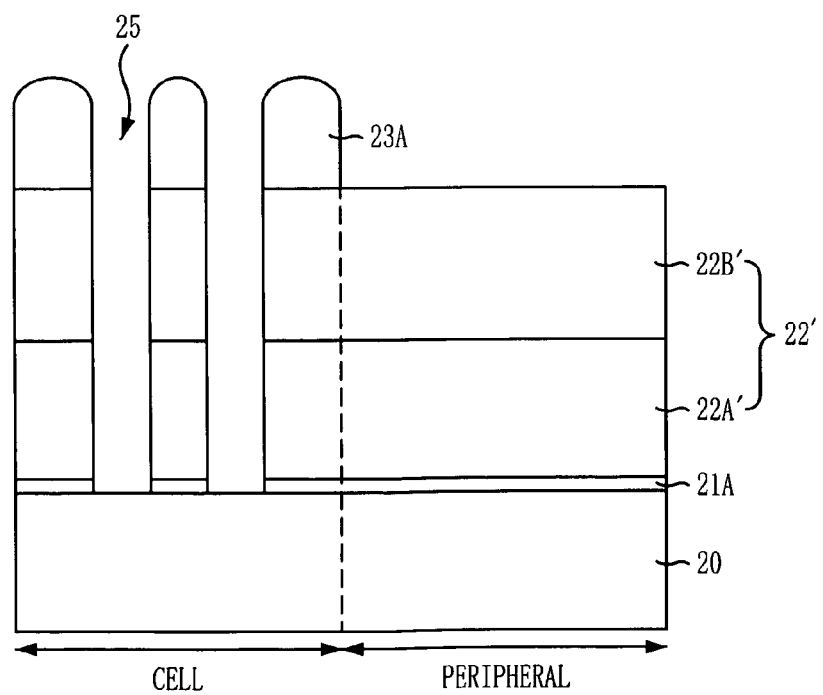

Referring to FIG. 2B, the hard mask 23 is etched by using the photoresist pattern 24 as an etch mask, and then the insulation layer 22 and the etch stop layer 21 in the cell region are successively etched by using an etched hard mask 23A as an etch barrier, thereby forming an electrode region 25 (e.g. for a storage node contact) exposing a portion of the substrate 20. An etching process on the insulation layer 22 in order to form the electrode region 25 in the cell region may be performed by using a gas mixture of argon (Ar) and $C_XF_Y$ gases, wherein, X ranges from 1 to 10 and Y ranges from 1 to 10. The photoresist pattern 24 may be removed during the etching process. In FIG. 2B, numerals 21A, 22A', 22B' and 22' represent an etched etch stop layer, an etched PSG layer, an etched PETEOS layer and an etched insulation layer, respectively, which are formed after performing the etching process on the etch stop layer 21, the PSG layer 22A, the PETEOS layer 22B and the insulation layer 22.

Figure 2C:
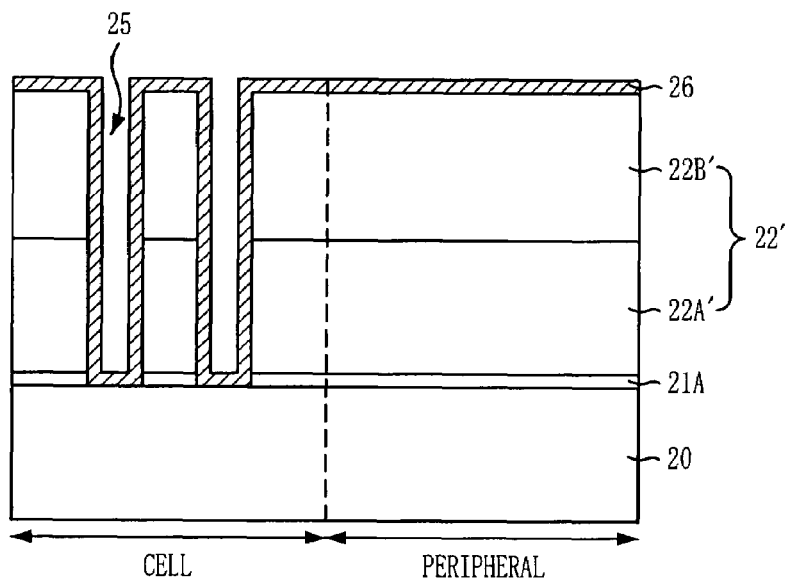

Referring to FIG. 2C, after removing the etched hard mask 23A, a conductive layer 26 is formed over a resultant structure in the cell region having the electrode region 25 and the peripheral region. The conductive layer 26 includes a titanium nitride (TiN) layer.

Figure 2D:
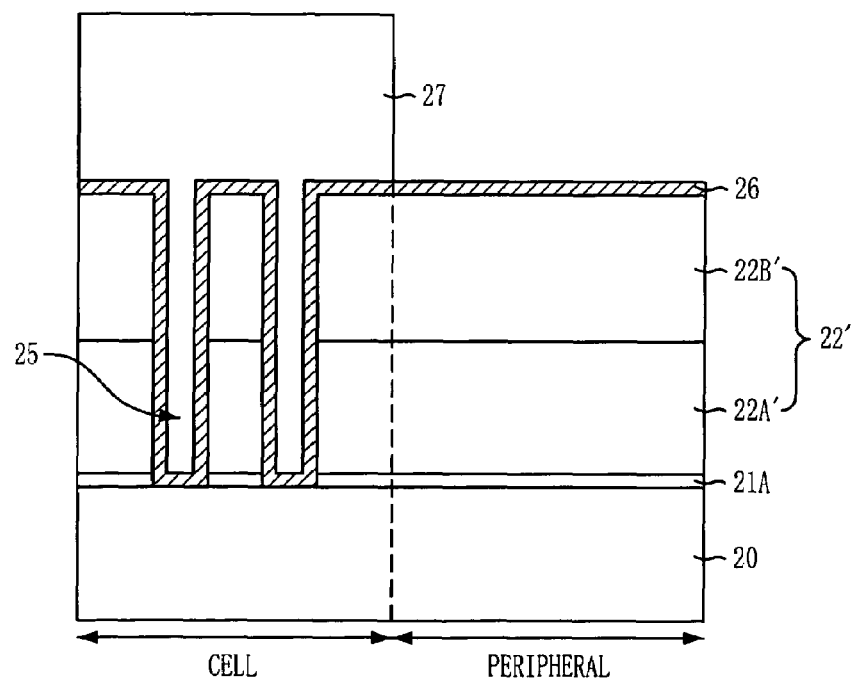

Referring to FIG. 2D, a mask pattern 27 is formed over the conductive layer 26 in the cell region but not on the peripheral region, in order to expose the conductive layer 26 in the peripheral region and cover the conductive layer 26 in the cell region. The mask pattern 27 includes a photoresist or an amorphous carbon.

Figure 2E:
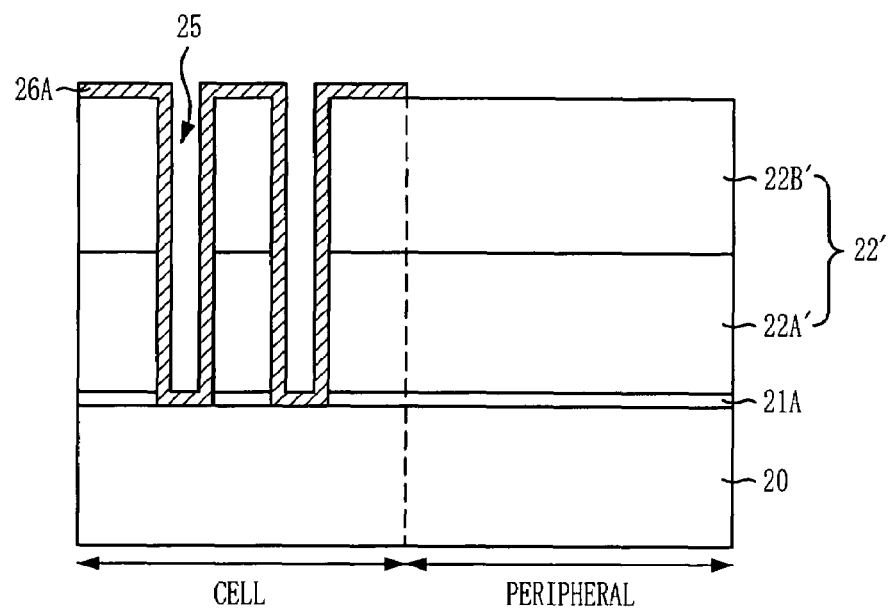

Referring to FIG. 2E, the conductive layer 26 in the peripheral region is removed by using the mask pattern 27 as an etch barrier. Then, the mask pattern 27 is removed. Thus, the conductive layer 26 remains merely over a resultant structure having the electrode region 25 in the cell region. A reference numeral 26A represents an etched conductive layer in the cell region which is formed after etching the conductive layer 26 in the peripheral region.

Figure 2F:
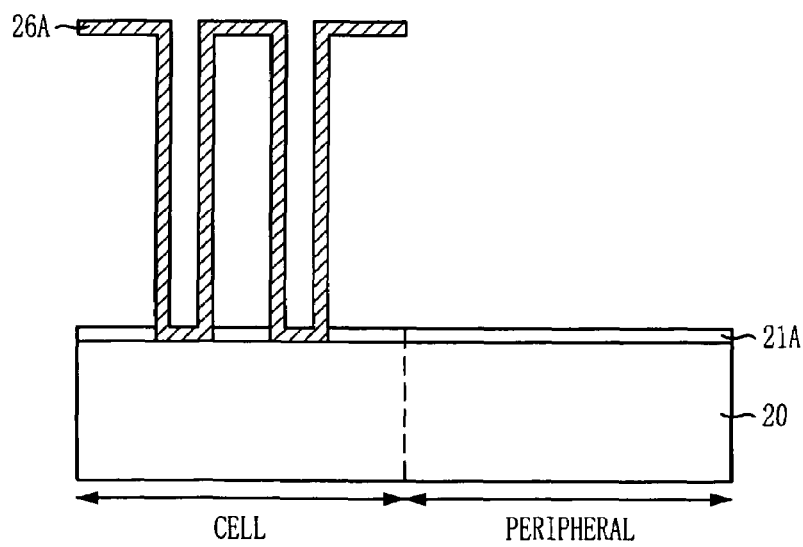

Referring to FIG. 2F, the etched insulation layer 22' in the cell region and the peripheral region is removed by a full-dip-out method using wet chemicals. Since the wet chemicals may percolate the cell region through the peripheral region, a portion of the etched insulation layer 22' in the cell region covered by the etched conductive layer 26A may be also removed. As a result, the conductive layer 26A only remains in the cell region. Thus, leaning to a neighboring storage electrode, which causes a bridge between neighboring storage electrodes, can be prevented by removing the insulation layer 22' prior to removing parts of the conductive layer 26A, which lie between the neighboring storage electrodes.

Figure 2G:
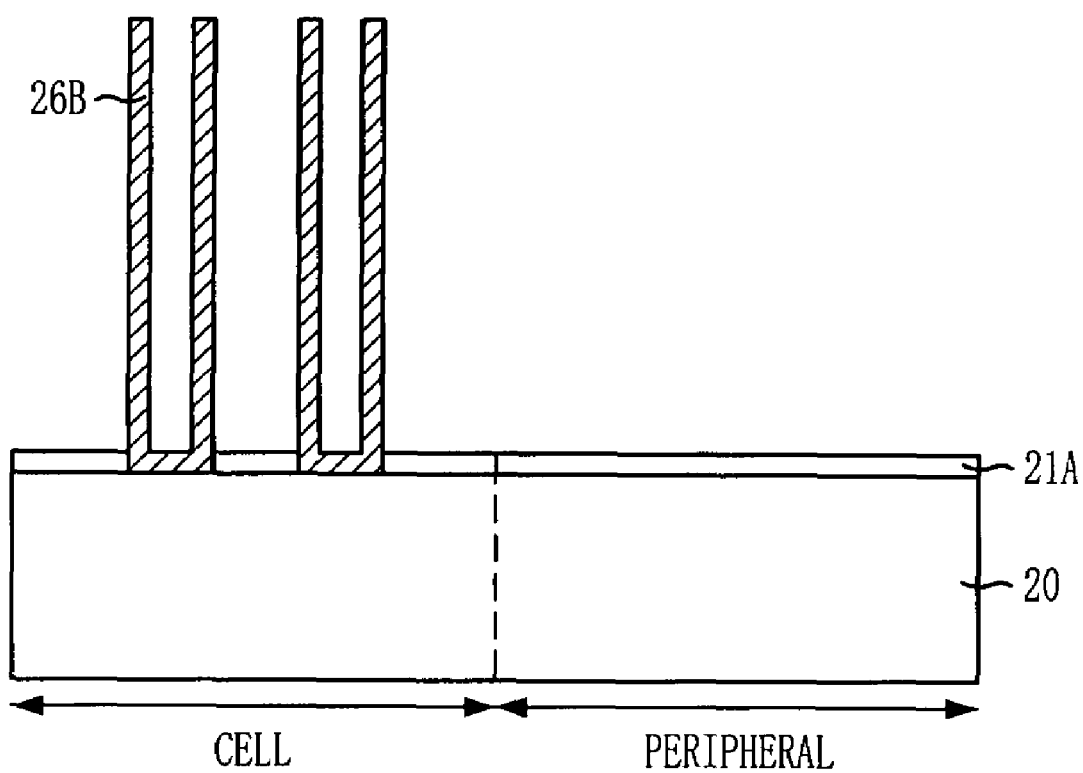

Referring to FIG. 2G, a cylinder type storage electrode 26B is formed by performing an etch back process and other processes on the conductive layer 26A to detach the nodes of the conductive layer 26A. Then, although it is not shown, a dielectric layer and plate electrodes are successively formed over a surface of the cylinder type storage electrode 26B and thus, a cylinder type capacitor may be formed.

The method for fabricating the cylinder type capacitor in accordance with the present invention can minimize defects of the semiconductor devices by preventing the bridge effect between neighboring storage electrodes and the leaning effect of the storage electrode by removing the insulation layer prior to separating nodes of the conductive layer for the storage electrodes.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a semiconductor device, the method comprising:

forming an etch stop layer and an insulation layer over a substrate having a first region and a second region;

selectively removing the insulation layer and the etch stop layer in the first region to expose parts of the substrate, thereby forming at least two electrode regions on the exposed substrate and a resultant structure;

forming a conductive layer over the resultant structure;

removing the conductive layer in the second region;

removing the insulation layer in the first region and the second region by using wet chemicals; and removing parts of the conductive layer, which formed between the at least two electrode regions in the first region, to form cylinder type electrodes in the first region, wherein forming the at least two electrode regions comprises:

forming a hard mask over the insulation layer in the first region;

forming a photoresist pattern over the hard mask;

etching the hard mask by using the photoresist pattern as an etch mask; and successively etching the insulation layer and the etch stop layer by using the etched hard mask as an etch barrier.

2. The method of claim 1, wherein the first region is a cell region and the second region is a peripheral region.

3. The method of claim 1, wherein the etch stop layer includes a nitride layer and the insulation layer includes an oxide layer.

4. The method of claim 3, wherein the insulation layer includes two stacked layers, one stacked layer having a wet etch rate higher than that of the other stacked layer.

5. The method of claim 4, wherein the one stacked layer includes a phosphosilicate glass (PSG) layer and the other stacked layer includes a plasma enhanced-tetra ethyl ortho silicate (PETEOS) layer.

6. The method of claim 1, wherein the hard mask includes an amorphous carbon layer.

7. The method of claim 1, wherein the hard mask includes a stacked structure of an amorphous carbon layer and a silicon oxynitride (SiON) layer.

8. The method of claim 1, wherein the hard mask includes a multi function hard mask (MFHM).

9. The method of claim 1, wherein selectively removing the insulation layer and the etch stop layer is performed by using a gas mixture of an argon (Ar) gas and a $C_XF_Y$ gas.

10. The method of claim 9, wherein the X in the $C_XF_Y$ gas ranges from approximately 1 to approximately 10 and the Y in the $C_XF_Y$ gas ranges form approximately 1 to approximately 10.

11. The method of claim 1, wherein the conductive layer includes a titanium nitride (TiN) layer.

12. The method of claim 1, wherein removing the conductive layer in the second region comprises:

forming a mask pattern over the conductive layer in the first region; and etching the conductive layer in the second region by using the mask pattern as an etch barrier.

13. The method of claim 12, wherein the mask pattern includes a photoresist or an amorphous carbon layer.

14. The method of claim 1, wherein removing the insulation layer is performed by a full-dip-out method.

15. The method of claim 1, wherein removing the parts of the conductive layer is performed by an etch back process.

16. The method of claim 1, further comprising, after removing the parts of the conductive layer in the first region, successively forming a dielectric layer and plate electrodes over the cylinder type electrodes.

* * * * *